(12) United States Patent
Shirdhonkar et al.

(10) Patent No.: US 7,129,862 B1
(45) Date of Patent: Oct. 31, 2006

(54) DECODING BIT STREAMS ENCODED ACCORDING TO VARIABLE LENGTH CODES

(75) Inventors: Sadanand Shirdhonkar, Bangalore (IN); Venkata Ratna Reddy Mullangi, Bangalore (IN)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 11/162,983

(22) Filed: Sep. 30, 2005

Related U.S. Application Data

(60) Provisional application No. 60/595,707, filed on Jul. 29, 2005.

(51) Int. Cl.
*H03M 7/40* (2006.01)

(52) U.S. Cl. .......................................... 341/67; 341/65

(58) Field of Classification Search ................... 341/67, 341/65, 51
See application file for complete search history.

(56) References Cited

U.S. PATENT DOCUMENTS 5,650,781 A * 7/1997 Park ............................ 341/67

OTHER PUBLICATIONS

"Information technology—Generic coding of audio-visual objects"—Part 2: Visual; Coding of moving pictures and audio;Oct. 1998; pp. 1-10 (Table of Contents), 105-106 & 197-206 (Total 22 Pages); ISO/IEC FDIS 14496-2;ISO/IEC; Atlantic City.

* cited by examiner

*Primary Examiner*—Rexford Barnie
*Assistant Examiner*—Joseph Lauture
(74) *Attorney, Agent, or Firm*—Robert D. Marshall, Jr.; W. James Brady; Frederick J. Telecky, Jr.

(57) ABSTRACT

A decoding approaching suitable for architectures such as Very Long Instruction Word (VLIW), in which throughput performance would be reduced in case if large blocks of conditional core are executed repetitively. Some of the code-words are received according to escape modes, which require different kinds of processing depending on specific mode. The decoding logic is partitioned into two parts, with the first part accessing entries in tables corresponding to code-words. The first part writes the symbol value retrieved from the accessed entry into an output buffer. In case of escape modes, the first part writes an intermediate decoded value to the output buffer, and an escape mode identifier retrieved from an accessed entry, and a position identifier in the output buffer for the symbol sought to be decoded in an intermediate buffer. The second part then performs the specific processing required for each entry in the intermediate buffer. The block sizes executed on conditions are reduced, thereby facilitating higher degree of parallelism and thus higher throughput performance.

20 Claims, 7 Drawing Sheets

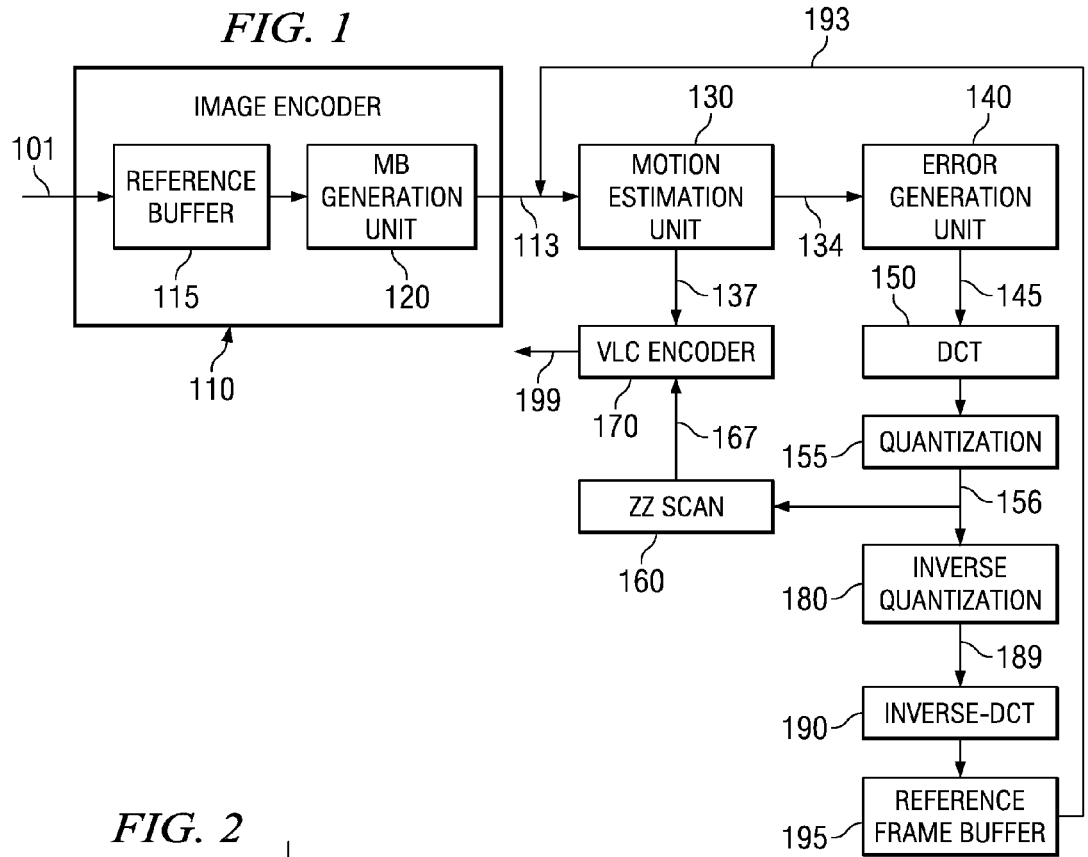
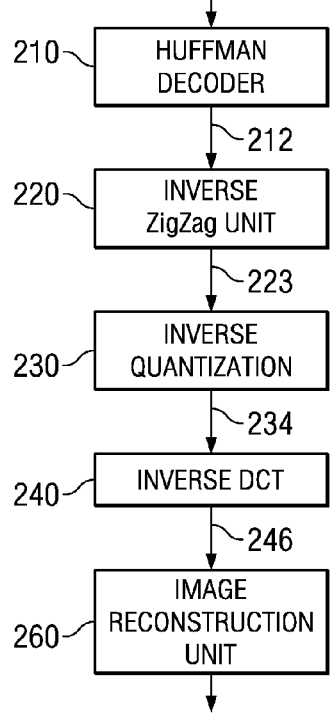

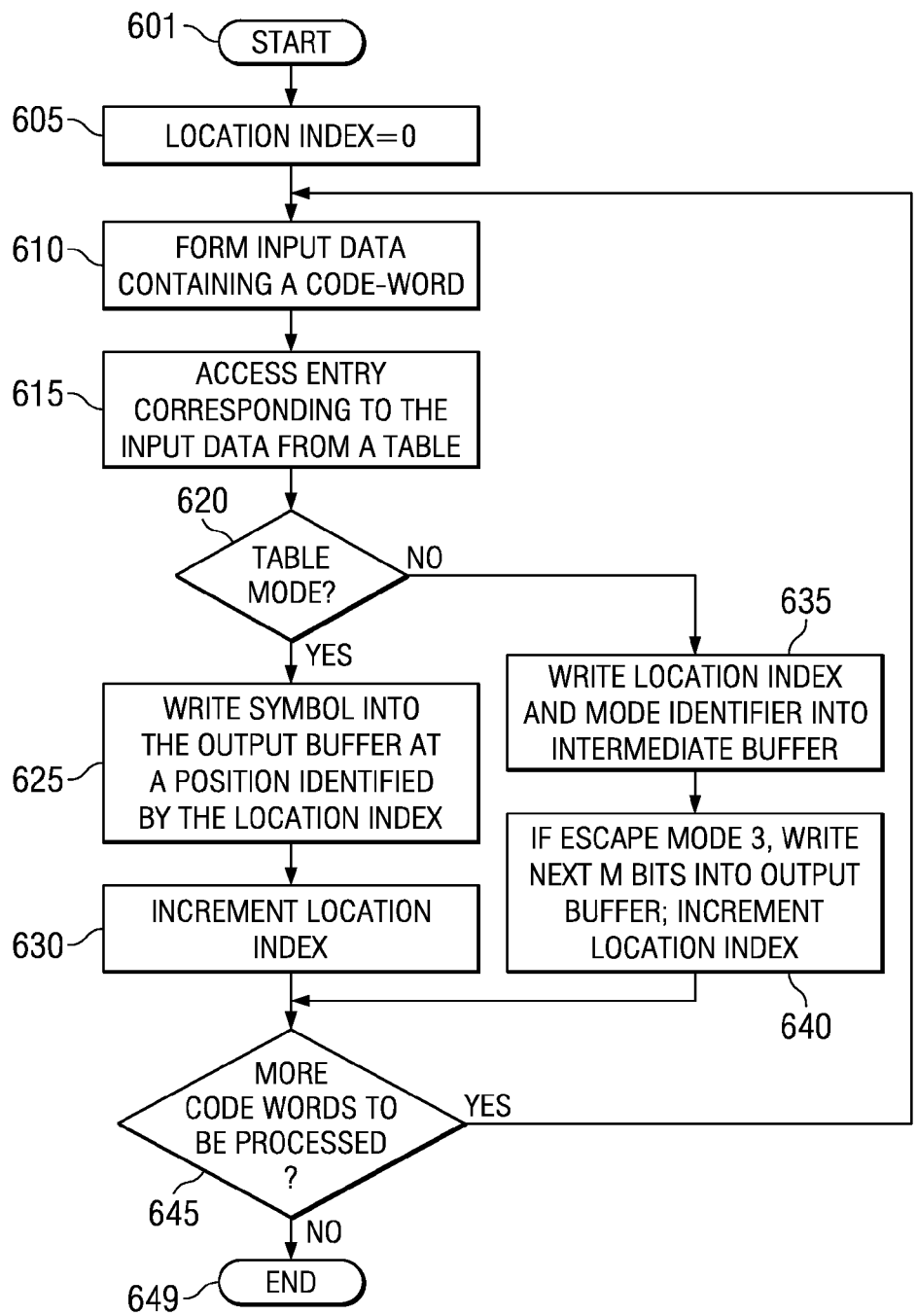

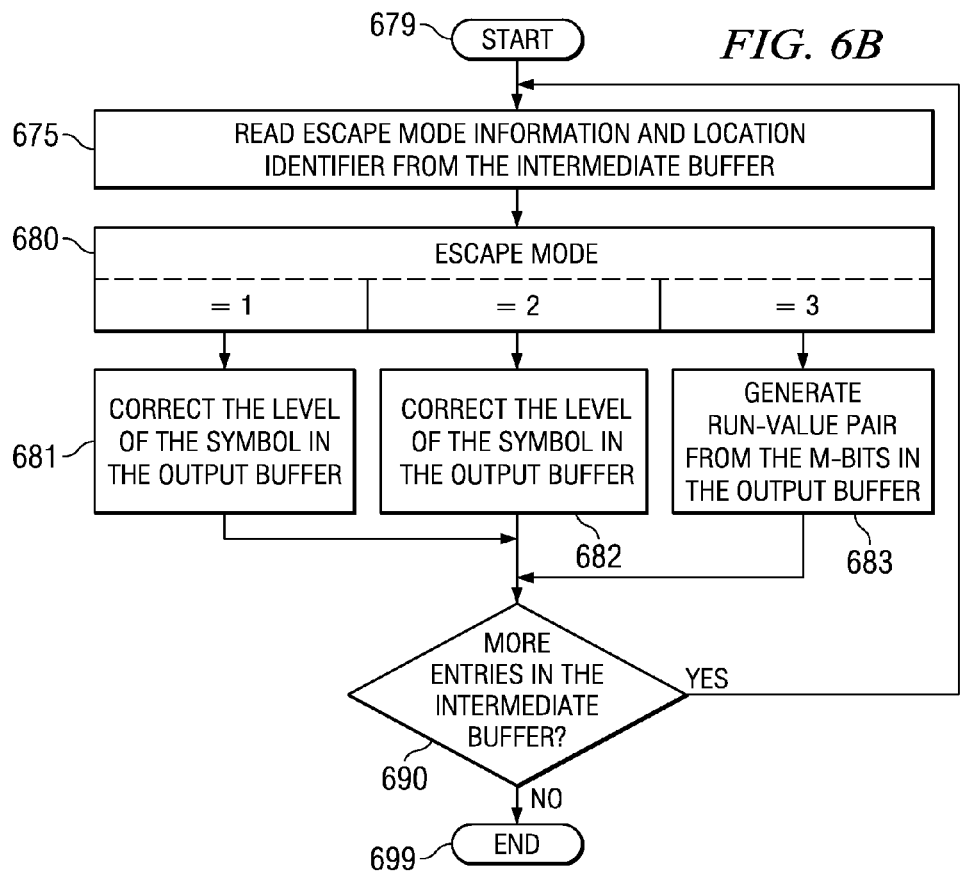
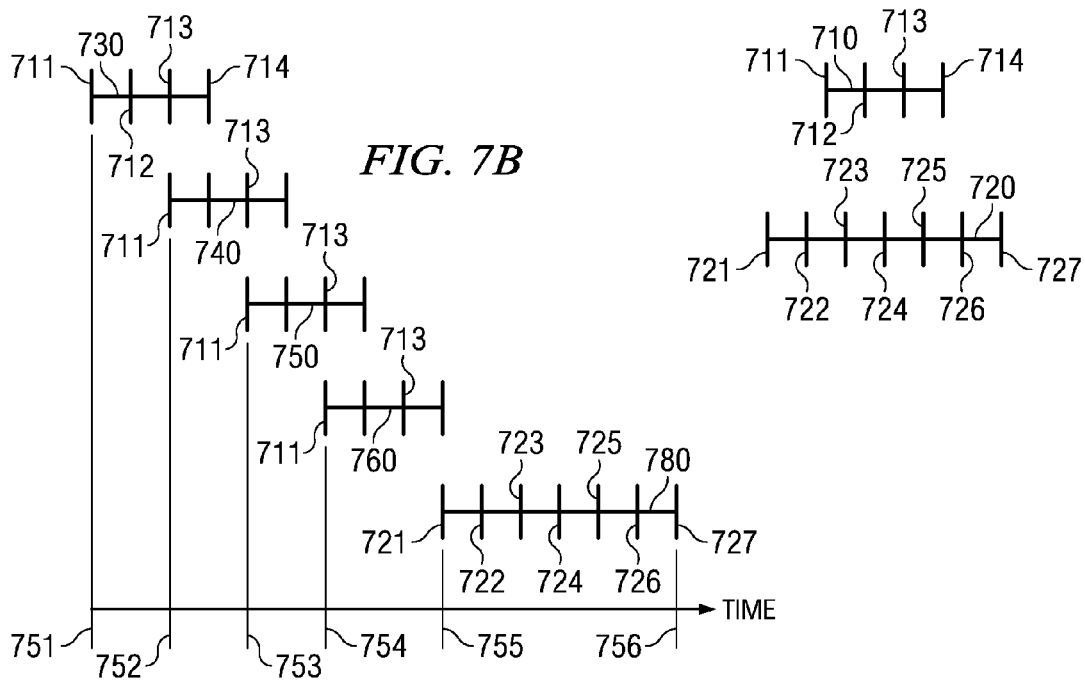

|     | 820 | 830 | 835 | 840 |
|-----|-----|-----|-----|-----|
| 811 | RUN | VALUE | MODE | BINARY CODE-WORD |
|     | 0 | 1 | TABLE MODE | 100 |
| 812 | 0 | 12 | TABLE MODE | 000001000000 |
| 813 | 0 | 13 | ESC 1 + (0,1) | 00000110100 |
| 814 | 28 | 1 | ESC 2 + (1,1) | 0000011101100 |
| 815 | 10 | 10 | ESC 3 | 00000111100010101 0000000010101 |
| 816 | 2 | 1 | (LAST) + TABLE MODE | 0011100 |

*FIG. 8A*

| 891 | 892 | 893 |
|-----|-----|-----|
| ESC CODE | ESC TYPE | CODE WORD FOR INTERMEDIATE VALUE |
| 0000011 | 0 | 100 |
| 0000011 | 10 | 1100 |
| 0000011 | 11 | 001010 10000000010101 |

ARRAY 1

|     | 910 | 920 | 930 |
|-----|-----|-----|-----|
|     | INDEX NUMBER | RUN 16 BIT | VALUE 16 BIT |
| 901 | 0. | 0 | 1 |
| 902 | 1. | 0 | 12 |
| 903 | 2. | 0 | 1 |
| 904 | 3. | 1 | 1 |
| 905 | 4. | 001010 10000000010101 | |
| 906 | 5. | 2 | 1 |

ARRAY 2

| INDEX NUMBER | ARRAY 1 INDEX | TYPE OF ESCAPE CODE IN ARRAY 1 |
|---|---|---|
| 0. | 2 | 1 |
| 1. | 3 | 2 |
| 2. | 4 | 3 |

ARRAY 1

| INDEX NUMBER | RUN 16 BIT | VALUE 16 BIT |
|---|---|---|
| 0. | 0 | 1 |
| 1. | 0 | 12 |
| 2. | 0 | 13 |
| 3. | 28 | 1 |
| 4. | 10 | 10 |
| 5. | 2 | 1 |

US 7,129,862 B1

DECODING BIT STREAMS ENCODED ACCORDING TO VARIABLE LENGTH CODES

RELATED APPLICATIONS

The present application is related to the U.S. Provisional Patent Application Ser. No. 60/595,707, entitled, "Decoding Bit Streams Encoded According to Variable Length Codes", filed on Jul. 29, 2005, naming as inventors: Sadanand Shirdhonkar and Venkata Ratna Mullangi, and is incorporated in its entirety herewith.

BACKGROUND

1. Field of the Invention

The present invention relates generally to compression technologies, and more specifically to a method and apparatus for decoding variable length codes (e.g., Huffman Encoding) while using optimal resources.

2. Related Art

Symbols are often encoded using variable length codes. Huffman encoding provides an example approach to such encoding. Variable length encoding has been used in several environments, typically due to the loss-less nature and the level of compression achieved.

In a typical scenario, an encoder encodes each input symbol to a corresponding bit string (code-word) using a pre-specified table, with the length of code-word potentially being different for different input symbols. In general, short length code-words are chosen for frequently occurring input symbols. A decoder then receives a bit stream containing such variable length code-words and constructs the symbols by using the inverse encoding tables (or corresponding information).

The decoding technique may need to be implemented while meeting various constraints in the corresponding environments. For example, in devices using VLIW (very large instruction word) processors, it may be desirable to avoid if conditions in the decoding operation. In addition, it may be desirable that the input characters be constructed quickly (using minimal processing power).

BRIEF DESCRIPTION OF THE DRAWINGS

Various features of the present invention will be described with reference to the following accompanying drawings.

FIG. 1 is a block diagram of the relevant portion of a digital video encoder device which encodes a sequence of symbols and generates corresponding sequence of code-words.

FIG. 2 is a block diagram of a relevant portion of a digital video decoder device in an embodiment of the present invention.

FIG. 6A is a flowchart illustrating the manner in which a first part is implemented to enhance throughput performance in decoding variable length code-words according to an aspect of present invention.

FIG. 6B is a flowchart illustrating the manner in which a second part generates symbols encoded in escape modes 1 and 2 from the intermediate buffer according to an aspect of present invention.

FIG. 7A is a pictorial representation of respective sets of instructions implementing the flowchart of FIGS. 6A and 6B.

FIG. 7B depicts the manner in which the execution of instructions in FIG. 7A is repeated to decode the symbols in an embodiment of present invention.

FIG. 8A depicts a few run value pairs and their corresponding code-words encoded according to MPEG-4 Huffman encoding tables.

FIG. 8B illustrates the manner in which escape modes are encoded and decoded in an embodiment.

FIG. 9A is a table illustrating the manner in which the entries of an output buffer are updated by first part in an embodiment of the present invention.

In the drawings, like reference numbers generally indicate identical, functionally similar, and/or structurally similar elements. The drawing in which an element first appears is indicated by the leftmost digit(s) in the corresponding reference number.

DETAILED DESCRIPTION

1. Overview

Figure 3:
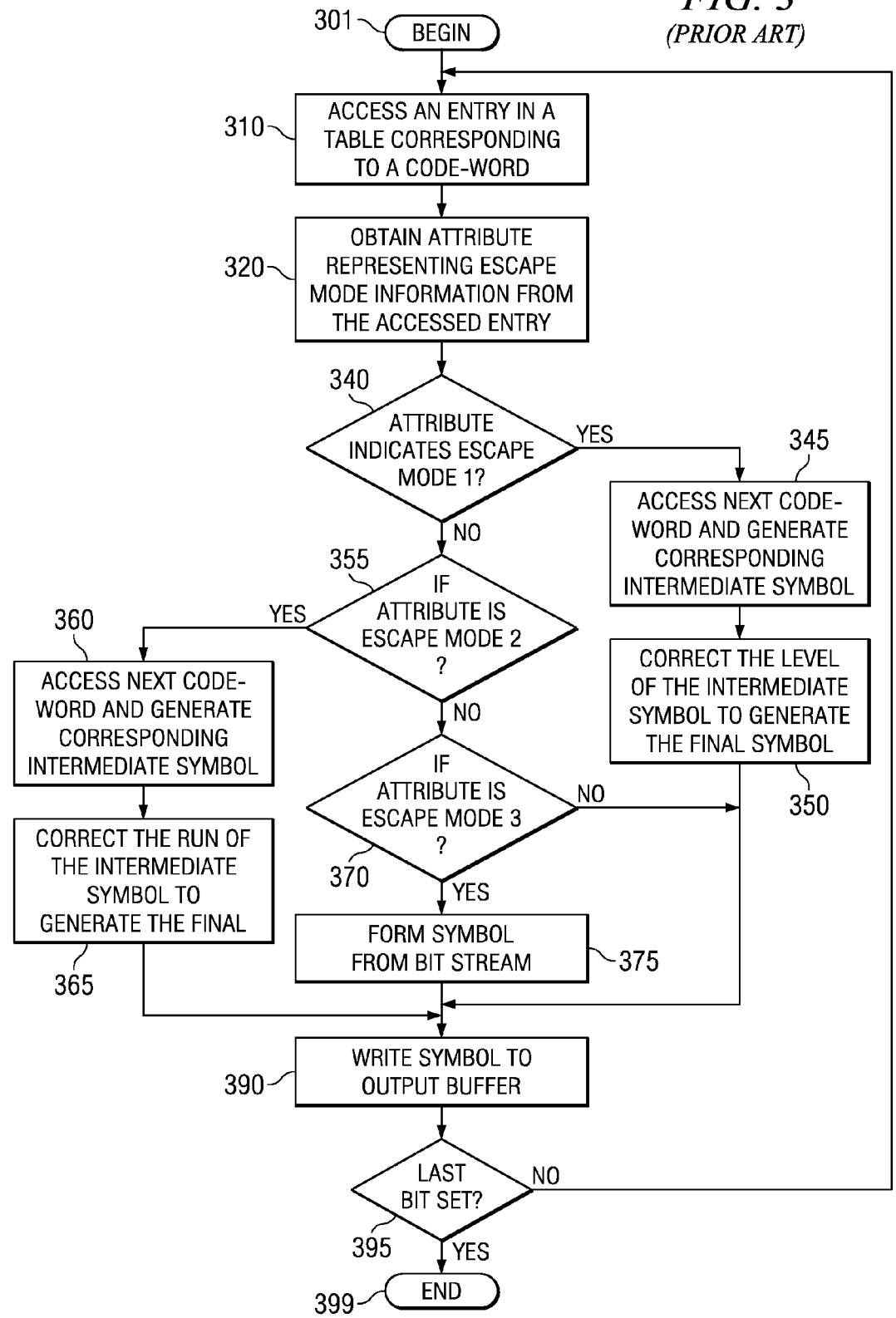
FIG. 3 is a flowchart illustrating the decoding approach of an example prior embodiment.

A decoding approach provided according to an aspect of the present invention generates a first symbol from a first code-word after generating a second symbol from a second code-word, even though the first code-word is located before the second code-word in a stream of symbols encoded according to an approach for compression.

In an embodiment, the approach allows variable length code-words, with some symbols being encoded according to escape modes. Various aspects of the present invention enable the symbols to be decoded while minimizing conditional processing (e.g., if conditions). Such a feature is particularly suited for Very Long Instruction Word (VLIW) type architecture based systems, which can more effectively exploit parallelism in the absence of conditional processing.

The conditional processing is minimized by splitting the decoding task into two distinct parts. The first part accesses a lookup table to identify symbol value in case of non-escape (or table) mode, and an intermediate value which requires appropriate further processing in case of escape modes. The data identifying the specific position (e.g., in the form of an index) in the sequence of symbols (sought to be generated by decoding) for each intermediate value, is written into an intermediate buffer (by the first part).

The second portion performs the necessary corrections to intermediate values according to respective escape modes to generate corresponding symbols, and writes the generated symbols into the corresponding specific locations in the sequence of symbols. As a result, after operation of the second portion, all the decoded symbols may be available, as desired. In an embodiment, the intermediate values are stored in the same locations of the output buffer, as where the corresponding final symbols are finally stored. As a result no additional memory may be required for storing intermediate values.

Due to such an approach, the first part can process several code-words (e.g., in a block or a macro-block) with a high throughput performance (e.g., one code-word decoded every pipeline cycle) in a pipelined architecture. The second part can also provide high pipelined throughput performance since the amount of processing to be performed depending on different escape codes is minimal, and the VLIW architecture may be designed to minimize/avoid reduction in throughput performance in case of such minimal conditional processing.

Several aspects of the invention are described below with reference to examples for illustration. It should be understood that numerous specific details, relationships, and methods are set forth to provide a full understanding of the invention. One skilled in the relevant art, however, will readily recognize that the invention can be practiced without one or more of the specific details, or with other methods, etc. In other instances, well-known structures or operations are not shown in detail to avoid obscuring the features of the invention.

2. Example Environment

FIGS. 1 and 2 together represent an example environment in which various aspects of the present invention can be implemented. Only the details of the components as believed to be relevant to an understanding of the operation of the described embodiments are provided in this application for conciseness. For further details, the reader is referred to documents related to the MPEG-4 Standards, well known in the relevant arts.

Broadly, FIG. 1 represents a digital video encoder device which compresses video frames into a format suitable for transmission/storage, and FIG. 2 represent a video decoder device reproducing the video frames. Even though shown as part of different devices, the components of the two Figures are often implemented in a single component (codec)/device, capable of both image capture and reproduction.

Continuing with respect to FIG. 1, the block diagram is shown containing image encoder 110, motion estimation (ME) unit 130, error generation unit 140, discrete cosine transform (DCT) unit 150, quantization unit (Q) 155, zigzag (ZZ) scan unit 160, variable length coder (VLC) 170, inverse quantization (IQ) unit 180, inverse DCT (IDCT) unit 190 and reference frame buffer 195. Each block is described below in further detail.

Image encoder 110 generates macro blocks (MB) on path 113 from video signal received on path 101. The video signal may be received in the form of a sequence of frames, with each frame containing multiple pixels. Each pixel is represented digitally in YCbCr format (well known in the art), wherein Y represents the luminance and Cb, Cr respectively represent the hue and saturation of a pixel. A video image containing 720*480 pixels can be logically divided into 1350 16*16 macro-blocks.

Each macro block (16×16 pixels) may be represented in formats such as 4:2:0 and 4:2:2 as well known in the relevant art. For example, in case of 4:2:0 format, each macro block contains six blocks (each block is of size 8×8 pixels), with 4 blocks representing Y(luminance), one block representing Cr and one block representing Cb.

Image encoder 110 is shown containing buffer 115 and MB generation unit 120. Buffer 115 holds an input frame received on path 101 for encoding and transmission (typically using various prediction approaches). MB generation unit 120 receives the input frame on path 112 and divides the input frame into a number of macro blocks (MB) noted above. Each macro block is provided on path 113 for further processing.

Motion estimation unit 130 receives a macro block on path 113 (input macro block) and a reference frame on path 193 (from reference frame buffer) and generates a motion vector. The motion vector generated generally represents a distance and direction in which a image portion (represented by macro block) has moved. The generated motion vector is provided on path 137.

Error generation unit 140 generates a residue macro block representing a difference (error) in the input macro block and corresponding reference macro block (obtained from reference frame buffer). The received macro block and reference macro blocks may be received either directly from respective paths 113 and 193 or may be received from motion estimation unit 130. The residue macro block is provided to DCT 150 on path 145.

Discrete cosine transform (DCT) unit 150 receives residue macro block from error generation unit 140 and provides a DCT coefficient block on path 156 as described in below paragraphs. DCT unit 150 performs discrete cosine transform (well known in the relevant arts) on the received residue macro blocks. DCT may be performed consistent with the format of macro block received. For example, macro block having format 4:2:0 may be divided into 4 luminance blocks and two chrominance blocks, and DCT may be performed on each block (8*8 pixel) sequentially.

Typically, a two dimensional DCT performed on each block (8*8 pixels) produces a block of DCT coefficients representing contribution of a particular combination of horizontal and vertical spatial frequencies in the original picture block. In an embodiment, DCT performed on an 8×8 block of 8 bit pixels produces DCT block of 8×8 with 11 bit coefficients. The coefficients at the lower frequencies typically contain higher energy (magnitude) and the energy content of other coefficients tend to zero. Quantization unit (Q) 155 quantizes the two dimensional DCT coefficient blocks and the quantized DCT values are provided on path to zigzag scan unit 160.

IDCT 190 receives the quantized values of DCT coefficient on path 156 and constructs a corresponding picture block by performing a inverse of discrete cosine transform. The constructed picture blocks are stored as reference frames in a reference frame buffer 195. The reference frames are provided to motion estimation unit 130 on path 193 for motion prediction.

Zigzag scanner 160 receives each quantized DCT coefficient block on path 156 and transforms the DCT coefficient block into one dimensional data suitable for variable length coding. Typically, the sequence of coefficients are picked such that both horizontal and vertical frequency increase in this order, and the variance of the coefficients decrease in the order. In one embodiment, the sequence of data is represented using a sequence run and value pairs (run-value pair) as described in further detail below. A run generally represents a number of zeroes before a non-zero value. The run-value pairs are provided on path 167.

Variable length coder (VLC) 170 generates a variable length code-word for each run value pair received on path 167. Variable length code-word may be generated using technique such as Huffman encoding etc. Generally, VLC 170 converts a run-value pair into a run-value-last triplet and generates a variable length code-word for each run-value-last triplet ("input symbol" in this embodiment). Here "last" indicates if the run-value pair is the last such pair in a given block.

The generated code-word are transmitted on path 199 in a desired format. Typically the information representing motion vectors, block formats, block size, etc., are transmitted as metadata along with the code-words. The manner in which a bit stream representing the code-words may be processed to construct the video frames is described below with reference to FIG. 2.

3. Receiving Components

FIG. 2 is a block diagram illustrating the manner in which code-words are processed to produce video frames for display. The block diagram is shown containing variable length decoder 210, inverse zigzag unit 220, inverse quantization unit (IQ) 230, inverse DCT (IDCT) 240, and image construction unit 260.

Inverse zigzag unit 220, inverse quantization unit (IQ) 230, inverse DCT (IDCT) 240, and image construction unit 260 respectively perform the reverse operation of zigzag (ZZ) scan unit 160, quantization unit 155, discrete cosine transform (DCT) unit 150 and a combination of blocks of image encoder 110, motion estimation (ME) unit 130. The components are described only briefly further, for conciseness.

Inverse zigzag unit 220 generates a quantized DCT coefficients block from a run-value-last triplet received from Huffman decoder 210. The size of the block is generally obtained from the metadata transmitted along with code-word as noted above. Inverse quantization unit (IQ) 230 performs inverse quantization and generates a DCT coefficients block. The generated DCT coefficient blocks are then provided to IDCT 240 on path 234.

Inverse DCT (IDCT) unit 240 performs inverse discrete cosine transform on the received set of coefficients(block) and generates pixel values in Y(luminance), Cr and Cb (color information) format. The generated pixels are generally provided as an image table. Image construction unit 260 receives the image information from the image table and metadata, to generate each frame of image for display.

Variable length decoder 210 decodes a sequence of code-words (contained in the sequence of bits received from the digital video encoder of FIG. 1) and generates the corresponding triplets (run-value-last triplet/symbols) corresponding to the code-words. Variable length decoder 210 may extract various metadata information and present the metadata information as a table. The triplets are provided to inverse zigzag unit 220.

In general, the decoding operation needs to be consistent with the encoding operation. Accordingly an example encoding approach is described first below.

4. Example Encoding Approach

In the example approaches described herein, a four mode VLC (variable length coding) is employed. The four modes are referred to as the default table mode, level escape mode (escape mode 1), run escape mode (escape mode 2) and full escape mode (escape mode 3). In the table mode, a (VLC) table exists (such as Huffman table for Huffman encoding), which maps the most commonly occurring run-level-last triplets to their corresponding variable length code-words.

Generally, Huffman (VLC) table in such an embodiment is characterized by parameters referred to as LMAX and RMAX. LMAX represents the maximum level of a given run listed in the table. RMAX represents the maximum run for the given level represented in the table. Accordingly a recived run-value pair is encoded in default table mode when received level is less than or equal to LMAX and received run value is less than or equal to RMAX ((level<=LMAX) and (run<=RMAX)). In this case, the code-word is obtained by indexing into the code-word table, using the level and run values.

Received run-value pair is encoded in level escape mode when received level value is greater than LMAX and less than twice of LMAX, and received run value is less than RMAX ((LMAX<level<=2*LMAX) and (run<=RMAX)). In such case, a new run-level pair is generated as new run=run and new level=level−LMAX. The new run and new level is encoded according default table mode and corresponding code-word is transmitted with a prefix code representing level escape mode.

Similarly, a run escape mode is used when RMAX<run<= (2*RMAX+1) and (level<=LMAX). The new run-level pair is generated as newrun=run−(RMAX+1) and new level=level. New run and new level is encoded according to default table mode and the corresponding code-word is transmitted with a prefix code representing run escape mode.

In the full escape mode, VLC 170 encodes the received run-value pair with an escape code followed by the actual run, length and last values. The full escape mode is used when the received run-level pair does not satisfy any of the above conditions. In the full escape mode, the code-word comprises of a predefined number of bits, that are used to send the run, level and last values without any encoding.

Decoding of the code-word needs to be performed consistent with the encoding operation described above. Various aspects of the present invention decode the code-words while using optimal resources. The advantages of the invention can be appreciated in comparison to some prior approaches. Accordingly, the prior decoding approaches are described briefly below.

5. Example Prior Decoding Approaches

FIG. 3 is a flowchart illustrating decoding approach of an example prior embodiment. The flowchart begins in step 301 and control passes to step 310. In step 310, VLD 210 accesses an entry in a table corresponding to a code-word. Various approaches may be used to determine the specific entry to be accessed.

In step 320, VLD 210 obtains an attribute representing escape mode information from the accessed entry. In an embodiment, the attributes information contained in the entry include the "last" bit, sign bit and the escape mode. In step 340, VLD 210 determines whether attribute indicates an escape mode 1. Control transfers to step 345 in case of escape code is 1 and to step 355 otherwise.

In step 345, VLD 210 accesses the next code-word and generates a corresponding intermediate value. In step 350, VLD 210 corrects the level of the intermediate value to generate the final symbol. Control then transfers to 390.

In step 355, VLD 210 determines whether attribute indicates escape mode 2. Control transfers to step 360 in case of escape code is 2 and to step 370 otherwise. In step 360, VLD 210 decodes the next code-word and generates a corresponding intermediate symbol. In step 365, VLD 210 corrects the run of the intermediate symbol to generate the final (decoded) symbol. Control then transfers to step 390.

In step 370, VLD 210 determines whether attribute indicates escape mode 3. Control transfers to step 375 in case of escape code is 3 and to step 390 otherwise (in which case the symbol is indicated in the access entry, without any escape mode processing). In step 375, VLD 210 forms the symbol from a number of bits of the bit stream. Control then transfers to step 390.

In step 390, VLD 210 writes the symbol to an output buffer. In step 395, VLD 210 checks whether decoded triplet indicates that the present codeword is the last code-word in the block. Control transfer to step 399 in case of last code-word, and to step 310 to continue processing the next code-word otherwise. The flowchart ends in step 399.

From the above, it may be appreciated that the symbols are generated (and written into output buffer) in the same sequence as in which the corresponding code-words are received.

In addition, it may be appreciated that substantial portion of the processing logic is 'conditional' (depending on the specific escape mode) processing. Such conditional processing is not conducive to high throughput performance, at least in some architectures, as described below with respect to Very Long Instruction Word (VLIW) architecture.

6. VLIW Architecture

Figure 4:
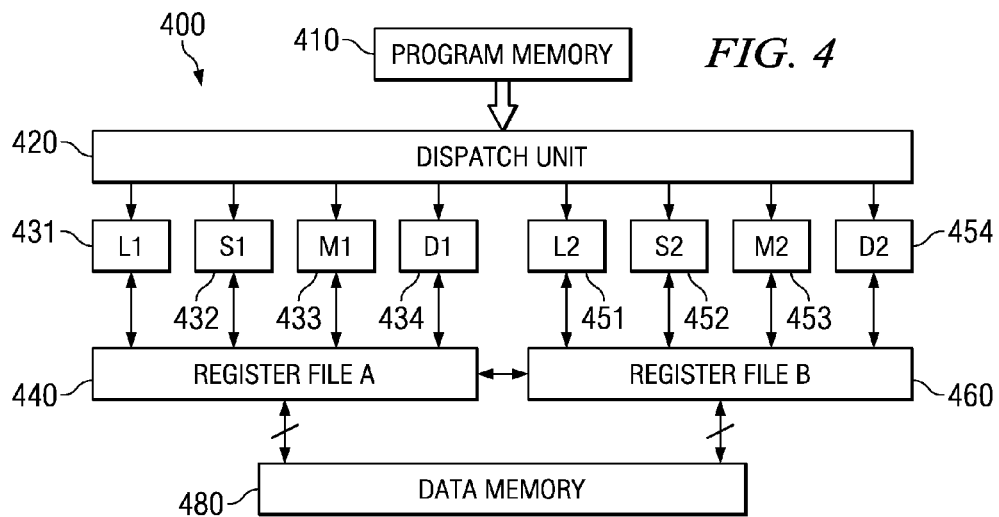
FIG. 4 is a block diagram illustrating the general features of a system implemented according to Very Long Instruction Word (VLIW) architecture.

FIG. 4 is a block diagram illustrating the general features of a system implemented according to Very Long Instruction Word (VLIW) architecture. System 400 is shown containing program memory 410, dispatch unit 420, processing units 431–434 and 451–454, register files 440 and 460, and data memory 480. Only the details of VLIW architecture as believed to be relevant to an understanding of the operation of the described embodiment, are provided in the present application. For further details on VLIW architecture, the reader is referred to a document entitled, "SPRU189—TMS320C6000 CPU and Instruction Set Reference Guide" and "SPRU197—TMS320C6000 Technical Brief", which are available from Texas Instruments, Inc., the assignee of the subject patent application.

Processing units 451–454 and register file 460 may respectively operate similar to processing units 431–434 and register file 440, and the description is not repeated for conciseness. The remaining blocks are described below in further detail.

Program memory 410 stores instructions, which operate to decode the code-words and generate corresponding symbols. Each processing unit 431–434 may be designed to perform corresponding set of operations (add, shift, multiply, conditional operation, etc.). Each processing unit is implemented according to a pipeline architecture, and generates one result each processing cycle in the steady state. Data memory 480 provides any data required during execution of instructions, and also stores the results of execution of instruction, if necessary.

Dispatch unit 420 retrieves small sets of instructions from program memory 410 and schedules the instructions for execution on a suitable processing unit. Each set of instructions is dispatched to the corresponding processing unit. Each of such set of instructions is preferably a loop that executes for many iterations, and the sub-sets should be executable in parallel such that parallelism can be exploited to the fullest in the pipeline architecture.

Register file 440 contains multiple registers used by processing units during execution. Some of the registers ("predicate registers") are used for conditional execution of single instructions. Generally, an instruction can be specified associated with a predicate register, and the instruction is executed (or completed) only if the predicated register is set to 1, otherwise the instruction is not executed.

Only a small number of such predicate registers (e.g., 6) are available, in one embodiment. The predicate registers may be designed (in hardware) such that the pipeline throughput performance is not impacted substantially. While the execution of instructions based on such predicate registers may not substantially impede the throughput performance, branch instructions may cause the throughput performance to be reduced substantially. Accordingly, it is desirable that the number of instructions processed conditionally be reduced.

Also, it may be appreciated that higher throughput performance may be obtained if consecutive loop iterations are independent of each other, i.e., the current loop iteration should not depend on the computations of the previous iteration. Otherwise, the next iteration cannot start till the current one has finished its computations. This condition can be quantified as the loop-carry dependency (LCD) bound. It is defined as the minimum delay required, from the point of start of the current iteration, to the point where the next iteration can start. The set of instructions contributing to the LCD bound form the critical path.

The approach described in FIG. 3, by its nature is linear with less scope for parallelism, as illustrated below with respect to FIGS. 5A and 5B.

7. Problems

Figure 5A:
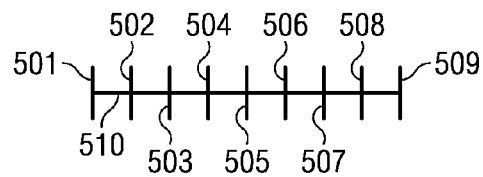
FIG. 5A is a pictorial representation of a set of instructions implementing the flowchart of FIG. 3.

In FIG. 5A, it is assumed that nine instructions 501–509 together implement the flowchart of FIG. 3, and in particular that instructions 501–503 implement steps 310–320, instructions 504–508 implement steps 340–375, and instruction 509 implements step 390.

Figure 5B:
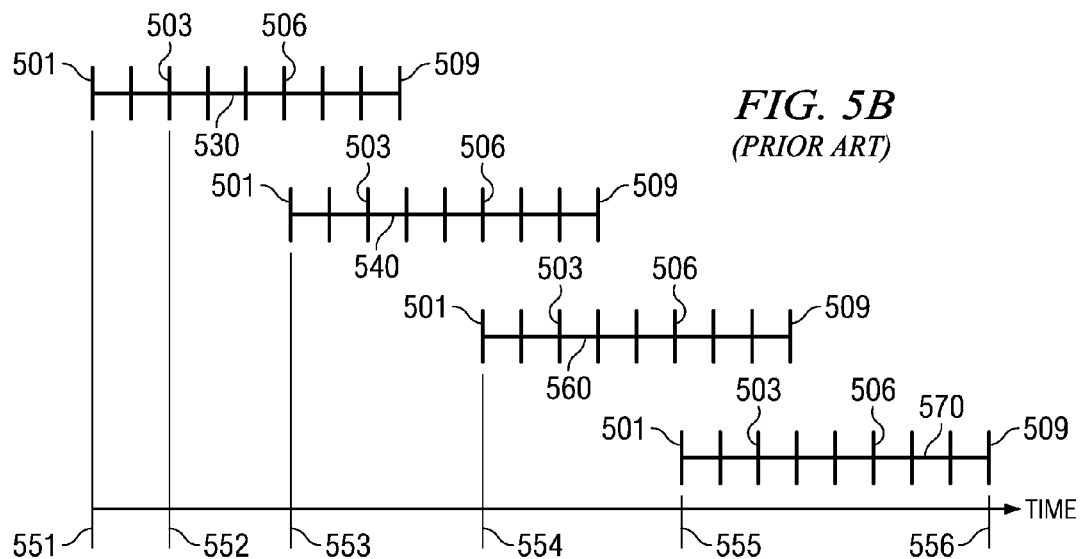
FIG. 5B depicts the manner in which the execution of instructions in FIG. 5A is repeated 4 times in time domain to decode four symbols.

FIG. 5B depicts the manner in which the execution of instructions of 501–509 is repeated 4 times (as shown by iterations 530, 540, 560 and 570) in time domain (line 550) to decode four symbols. As can be readily appreciated, iteration 540 starts only after completion of execution of instruction 506 of iteration 530.

Thus, the loop carry dependency (representing absence of parallelism) is shown in duration 551–553. Of that, 551–552 is due to data dependency since the decoding of second code-word cannot be started until the length of the first code-word (from iteration 530) is determined. Duration 552–553 is due to the conditional processing of escape code in iteration 530).

Similarly, loop carry dependency delays 553–554 and 554–555 correspond to iterations 540 to 560, and 560 to 570 respectively. The decoding of the four symbols is shown completing at time point 556. The manner in which various aspects of the present invention allow such delays to be reduced, is described below in further detail.

8. Enhancing Throughput Performance in Decoding Variable Length Code-Words

According to an aspect of the present invention, the number of instructions processed depending on a condition is reduced by dividing the decoding logic into two separate parts, with the first part merely accessing the relevant entries from a table and writing the intermediate value to an intermediate buffer in case of escape modes.

The second part corrects the intermediate values as needed by the corresponding escape mode to generate the corresponding symbols. The generated symbols are written into an output buffer at appropriate locations specified by the first part. The first part writes the symbols directly into the output buffer in case of non-escape modes. The operation of the first and second parts are respectively described below with respect to FIGS. 6A and 6B.

FIG. 6A is a flowchart illustrating the manner in which a first part is implemented to enhance throughput performance in decoding variable length code-words. The flowchart is described with respect to FIG. 2 merely for illustration. However, the approaches can be implemented in various other environments. The flowchart begins in step 601, in which control immediately passes to step 605.

In step 605, VLD 210 sets a location index to 0. The location index is used to identify the position in the output buffer, as described below in further detail. In step 610, VLD 210 forms input data containing a code-word (from the sequence of bits received as input). In step 615, VLD 210 accesses an entry corresponding to the input data from a table.

In step 620, VLD 210 determines whether the code-word is related to a symbol encoded according to table mode (i.e., without escape modes). A field in the accessed entry indicates the mode of encoding. Control passes to step 625 in case of table mode, and to step 635 otherwise.

In step 625, VLD 210 writes the symbol value contained in the accessed entry into the output buffer at a position identified by the location index. It should be appreciated that in case the code-word in the prior iteration corresponds to an escape mode, the symbol value of the present iteration represents an intermediate value which needs to be further processed according to the escape mode.

In case the code-word in the prior iteration does not correspond to an escape mode, the symbol value of the present iteration represents the symbol corresponding to the present code-word according to the table mode. In step 630, VLD 210 increments the location index, and control then passes to step 645.

In step 635, VLD 210 writes the location index and mode identifier into the intermediate buffer in case the present entry indicates that the symbol being presently decoded is according to escape mode. In step 640, in case the present code word indicates escape mode 3, VLD 210 writes the next M bits into output buffer and increments the location index, wherein M represents the number of bits representing the symbol.

In step 645, VLD 210 checks whether there are more code-words to be processed. Control passes to step 610 to process additional code-words, or else to step 649, in which the flowchart ends.

Thus, by operation of the flowchart of FIG. 6A, the decoded symbol values in the accessed entries, whether representing the final symbol or the intermediate values requiring additional processing, are written in the output buffer. The intermediate buffer contains additional information indicating the mode identifier and the values in the output buffer, which require additional processing according to the corresponding mode identifier. The manner in which a second part processes the information in the intermediate buffer to generate the corresponding symbols is described below with respect to FIG. 6B.

FIG. 6B is a flowchart illustrating the manner in which a second part generates symbols encoded in escape modes from the intermediate buffer noted in FIG. 6A. The flowchart begins in step 671, in which control transfers to step 675.

In step 675, VLD 210 reads escape mode identifier and location identifier from the intermediate buffer. The location identifier identifies the location in the write buffer where the corresponding intermediate value, which needs to be corrected according to the escape mode identifier, is present.

Additional processing depends on the escape mode identifier as represented by step 680. In case of escape mode 1, in step 681, VLD 210 corrects the level of the symbol in the output buffer. Level correction generally entails adding the LMAX value corresponding to the run value. The corrected level value is written back to the output buffer.

Similarly, in case of escape mode 2, in step 682, VLD 210 corrects the level of the symbol (intermediate value) in the output buffer. In case the mode identifier equals escape mode 3, in step 683, VLD 210 generates the symbol (run-value pair) from the M-bits in the output buffer.

In step 690, control passes to step 675 if there are additional entries in the intermediate buffer. Otherwise, the flowchart ends in step 699. From the above, it may be appreciated that the output buffer would contain all the sequence of symbols corresponding to the sequence of code-words received by VLD 210.

It may further be appreciated that the code-words not encoded in escape modes, are generated in FIG. 6A (and stored in the output buffer) before the code-words encoded according to escape modes, even if the code-words encoded according to escape modes are present ahead in the received sequence.

Also, the loop of FIG. 6B is executed only as many times as the number of occurrences of code-words encoded according to escape modes.

Further, As the decoding process is split into two independent parts, the number of conditional instructions executed in each part is reduced. Hence such conditional instructions may be executed using the predicate registers noted above in VLIW architectures, instead of using branches for conditional execution. As a result, the code can be scheduled and characteristic VLIW throughput performance is achieved, which is superior compared to the approach of FIG. 3. The increase in throughput performance compared to FIGS. 5A and 5B, is illustrated below with respect to FIGS. 7A and 7B.

9. Timing Diagram Illustrating the Enhanced Throughput Performance

FIG. 7A is shown containing two sets of instructions 710 and 720 respectively executing flowchart of FIGS. 6A and 6B. It is assumed that instruction set 710 contains four instructions 711–714 and instruction set 720 contains seven instructions 721–727, and in particular that instructions 711–713 implement steps 610–615 and instruction 714 implements steps 620 to 645. Instructions 721–727 implement flowchart 6B for all the entries in the intermediate buffer (described above).

FIG. 7B depicts the manner in which the execution of instructions of 711–714 is repeated 4 times (as shown by iterations 730, 740, 760 and 770) and once execution instruction 721–727 (as shown by iteration 780) in time domain (line 750). Four iterations 730, 740, 760 and 770 are performed to access the relevant entries from a table and writing the intermediate value to an intermediate buffer in case of escape modes. Multiple iterations of 780 are performed to correct the intermediate values according to the corresponding entries in the intermediate buffer.

As can be readily appreciated, iteration 740 starts after completion of execution of instruction 713 of iteration 730. Such a loop carry dependency is due to data dependency since the decoding of second code-word cannot be started until the length of the first code-word (from iteration 530) is determined. However, loop carry dependency due to conditional processing (552–553 as in case of prior art in FIG. 5) is reduced by not performing decoding operations (in iterations 730,740,750 and 760) corresponding to symbols encoded in escape mode.

Iteration 780 may consume minimal processing time since iteration 780 is performed only for the number of escape codes received. Further, iteration 780 may be started before (the shown) time point 755 while decoding subsequent set of symbols, thereby enabling further parallelism. In comparison with FIG. 5B, it may be appreciated that the throughput performance in generating the symbols is enhanced by using parts 1 and 2.

Manner in which first part in FIG. 6A and second part in FIG. 6B is implemented is illustrated in further detail below with an example.

10. Example

FIG. 8A contains a table (referred in various approaches described above) representing a portion of an example Huffman table used for encoding run value pairs by Huffman encoder 170. Rows 811–816 respectively represents entries corresponding 6 run-value pairs, columns 820, 830, 835 and 840 respectively represents run, value, mode indicator indicating one of the four modes in which corresponding run-value are coded, and a digital code resulting from encoding the corresponding run-value-last triplets, which is then transmitted.

Run-value-last triplets in rows 811 and 812 and 816 are respectively encoded in table mode or without escape mode, (as indicated in column 835) with the corresponding digital codes 100, 000001000000 and 0011100. The run-value-last triplets in rows 813–815 are encoded respectively in escape modes 1, 2 and 3 (as indicated in column 835). Accordingly the corresponding digital codes are represented in column 840.

The table in FIG. 8B further illustrates the manner in which the sequence of bits of column 840 contain code-words represent the run-value pair (symbols) in columns 820/830 in case of representation by escape modes (rows 813–815). The manner in which the symbols of rows 813–815 represent corresponding code-words is respectively illustrated by rows 881–883.

Column 891 of all three rows 881–883 contains a bit sequence 0000011 indicating that the symbols of all the three rows are encoded according to an escape mode. In the following bit positions, values of 0, 10, and 11 respectively represent escape modes 1, 2, and 3 respectively as represented by column 892. For modes 1 and 2, the last, not-last status is indicated by the Huffman code-word of the modified run-value pair, whereas for escape mode 3, another bit (0 for not-last) is appended to the escape mode code-word. Thus, the code-word for escape modes 1, 2 and 3 respectively equal 00000111, 000001110, and 0000011110.

Column 893 indicates intermediate values corresponding to each escape code in row 813–815. In case of escape mode 3 the intermediate value is shown containing the binary representation of corresponding run-level (10, 10) value in row 815. Accordingly, the bits following the code-word representing the escape mode identifier, are used to determine the symbols. Thus, in case of escape modes 1 and 2, the code-word following the escape mode identifier code-word is decoded to generate the intermediate value. Thus, with respect to rows 813, 811 and 881, it may be appreciated that intermediate value generated for symbol (0, 13) equals (0, 1) assuming LMAX=12. In case of escape mode 3, the run and values are represented in binary values as shown in rows 815 and 883.

The manner in which the code-words encoded according to the table in FIG. 8A are decoded using the approach described above is illustrated below with reference to FIGS. 9A–9C. In other words, the manner in which each entry of column 840 would be decoded is described below. It is further assumed that all these six code-words are part of a single macro-block (of a video image frame, noted above) and received in successive positions.

Figures 9B, 9C, 10:
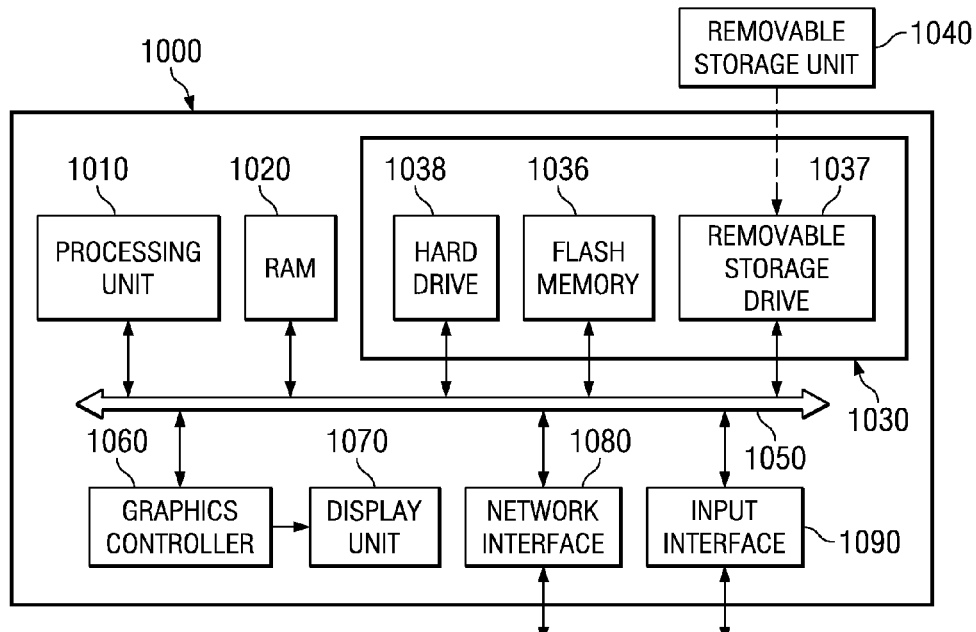
FIG. 9B is a table illustrating an example intermediate buffer containing intermediate values updated by first part in one embodiment.
FIG. 9C is a table illustrating an example output buffer containing the final entries updated by the second part in an embodiment of the present invention.
FIG. 10 is a block diagram illustrating the details of an example system in which various aspects of the present invention are operative by execution of appropriate software instructions.

Broadly, the flowchart of FIG. 6A generates the output buffer of FIG. 9A and intermediate buffer of FIG. 9B when processing the successive code-words of column 840 received in successive positions. The flowchart of FIG. 6B then processes each entry of FIG. 9B to update the entries in FIG. 9A to generate the final values in output buffer of FIG. 9C.

Now with respect to FIG. 9A, the first part (flowchart of FIG. 6A), generates six entries 901–906 in output buffer 900 corresponding to each of the symbols of rows 811–816. The six entries are assigned index values of 0–5 as shown in column 910. As may be appreciated from rows 901, 902 and 906 (corresponding to rows 811, 812 and 816), the run level values of code-words in non-escape mode are written by operation of the first part.

However, in case of escape modes 1 and 2, the intermediate values of column 835 (of rows 813 and 814 respectively) are written into corresponding rows (903 and 904) of columns 920 and 930. It should be appreciated that the intermediate values in case of escape modes and also code-words in case of table mode are generated using similar processing logic, and thus both can be written into output buffer 900 without requiring conditional processing logic. In case of escape mode 3, as shown in row 905, the bits following the escape mode code-word are written into columns 920 and 930, as desired. (NOTE: in FIG. 9A, row 909 should be 904)

The flowchart of FIG. 6B (part 2) processes every entry/row in the intermediate buffer 949 of FIG. 9B. Thus, with respect to row 911, part 2 reads the array 1 index value 2 and the escape type 1 (corresponding to level escape). Part 2 generates a new run-value pair (0, 13) by adding a maximum value (in this case, assumed to be 12 for run 0) to the value in row 903, column 930. The corrected run-value pair is updated in to array 1 as shown in row 973 (corresponding to row 903 of FIG. 9A) FIG. 9C. The processing of remaining entries of FIG. 9B is similarly described.

It should also be appreciated that the features described above may be implemented in various combinations of hardware, software and firmware, depending on the corresponding requirements. The description is continued with respect to an embodiment in which the features are operative upon execution of the corresponding software instructions.

11. Digital Processing System

FIG. 10 is a block diagram of computer system 1000 illustrating an example system for implementing the decoder noted above. Computer system 1000 may contain one or more processors such as central processing unit (CPU) 1010, random access memory (RAM) 1020, secondary memory 1030, graphics controller 1060, display unit 1070, network interface 1080, and input interface 1090. All the components except display unit 1070 may communicate with each other over communication path 1050, which may contain several buses as is well known in the relevant arts. The components of FIG. 10 are described below in further detail.

CPU 1010 may execute instructions stored in RAM 1020 to provide several features of the present invention. CPU 1010 may contain multiple processing units, with each processing unit potentially being designed for a specific task. Alternatively, CPU 1010 may contain only a single processing unit. RAM 1020 may receive instructions from secondary memory 1030 using communication path 1050. In addition, RAM 1020 may store the various buffers/arrays described above.

Graphics controller 1060 generates display signals (e.g., in RGB format) to display unit 1070 based on data/instructions received from CPU 1010. Display unit 1070 contains a display screen to display the images defined by the display signals. The decoded video frames may be displayed on the display screen. Input interface 1090 may correspond to a keyboard and/or mouse, and generally enables a user to provide inputs. Network interface 1080 enables some of the inputs (and outputs) to be provided on a network.

Secondary memory 1030 may contain hard drive 1038, flash memory 1036 and removable storage drive 1037. Secondary storage 1030 may store the software instructions and data (e.g., the VLC tables), which enable computer system 1000 to provide several features in accordance with the present invention.

Some or all of the data and instructions may be provided on removable storage unit 1040, and the data and instructions may be read and provided by removable storage drive 1037 to CPU 1010. Floppy drive, magnetic tape drive, CD-ROM drive, DVD Drive, Flash memory, removable memory chip (PCMCIA Card, EPROM) are examples of such removable storage drive 1037.

Removable storage unit 1040 may be implemented using medium and storage format compatible with removable storage drive 1037 such that removable storage drive 1037 can read the data and instructions. Thus, removable storage unit 1040 includes a computer readable storage medium having stored therein computer software and/or data. An embodiment of the present invention is implemented using software running (that is, executing) in computer system 1000.

In this document, the term "computer program product" is used to generally refer to removable storage unit 1040 or hard disk installed in hard drive 1031. These computer program products are means for providing software to computer system 1000. As noted above, CPU 1010 may retrieve the software instructions, and execute the instructions to provide various features of the present invention described above.

12. Conclusion

While various embodiments of the present invention have been described above, it should be understood that they have been presented by way of example only, and not limitation. Thus, the breadth and scope of the present invention should not be limited by any of the above described exemplary embodiments, but should be defined only in accordance with the following claims and their equivalents.

What is claimed is:

1. A method of decoding a sequence of code-words representing a corresponding sequence of symbols in a compressed format according to an approach, said method comprising:

receiving a first code-word and then a second code-word, wherein said first code-word and said second code-word are contained in said sequence of code-words, and wherein said first code-word is earlier than said second code-word in said sequence of code-words; and generating a first symbol from said first code-word after generating a second symbol from said second code-word, wherein said first code-word and said second code-word respectively are encoded using said first symbol and said second symbol according to said approach.

2. The method of claim 1, wherein said approach encodes symbols using variable length code-words.

3. The method of claim 2, wherein said approach provides a plurality of escape modes for some of said code-words, each of said plurality of escape modes using an immediately following code-word to generate a corresponding symbol, wherein a first plurality of code-words are generated from said first symbol during encoding using a first escape mode, said first plurality of code-words comprising said first code-word and a first immediately following code-word, said method further comprising:

providing a table containing a plurality of entries, wherein said table provides a first entry, a second entry or a third entry as an output in response to respectively receiving said first code-word, said second code-word or said first immediately following code-word (FIFC), wherein said first entry contains data indicating whether the encoding is according to said first escape mode, said second entry indicating said second symbol, and said third entry indicates an intermediate value;

executing a first part which accesses said first entry from said table when decoding said first code-word, said first part examining said first entry to determine that the encoding is according to said first escape mode, said first part receiving said FIFC immediately following said first code-word and accessing said third entry, said first part writing data indicating said first escape mode to an intermediate buffer, said first part accessing said second entry from said table when decoding said second code-word, said first part writing said second symbol to an output buffer; and executing a second part which reads data indicating said first escape mode from said intermediate buffer and performs an operation using said intermediate value consistent with the requirement of said first escape mode according to said approach.

4. The method of claim 3, wherein said first part writes data into said intermediate buffer indicating a position of said first symbol according to said sequence, wherein said second part writes said first symbol at said position.

5. The method of claim 4, wherein said first part processes a first plurality of symbols and writes corresponding entries in said intermediate buffer and said output buffer, and said second part thereafter starts processing entries in said intermediate buffer and said output buffer.

6. The method of claim 5, wherein each of said plurality of symbols contains a run and a level, wherein said first mode comprises escape mode 1, wherein said operation comprises adding a maximum level for a corresponding run value to a level in said intermediate value, wherein the resulting added level and a run in said intermediate value comprise said first symbol.

7. The method of claim 5, wherein each of said plurality of symbols contains a run and a level, wherein said first mode comprises escape mode 2, wherein said operation comprises adding a maximum run corresponding to said level to a run in said intermediate value, wherein the resulting added run and a level in said intermediate value comprise said first symbol.

8. The method of claim 7, wherein said first part further operates to:

receive a third code-word;

access a third entry from said table based on said third code-word, said third entry indicating that encoding is according to escape mode 3; and writing in said intermediate buffer a fixed number of bits following said third code-word in said stream of code-words, wherein said second part retrieves said fixed number of bits from said intermediate buffer and writes to said output buffer as a third symbol.

9. The method of claim 8, wherein said first part and said second part are executed in a processor implemented according to Very Long Instruction Word (VLIW) architecture.

10. The method of claim 8, wherein said plurality of symbols represent image data according to MPEG standard.

11. A computer readable medium carrying one or more sequences of instructions causing a system to decode a sequence of code-words representing a corresponding sequence of symbols in a compressed format according to an approach, wherein execution of said one or more sequences of instructions by one or more processors contained in said system causes said one or more processors to perform the actions of:

receiving a first code-word and then a second code-word, wherein said first code-word and said second code-word are contained in said sequence of code-words, and wherein said first code-word is earlier than said second code-word in said sequence of code-words; and generating a first symbol from said first code-word after generating a second symbol from said second code-word, wherein said first code-word and said second code-word respectively are encoded using said first symbol and said second symbol according to said approach.

12. The computer readable medium of claim 11, wherein said approach encodes symbols using variable length code-words.

13. The computer readable medium of claim 12, wherein said approach provides a plurality of escape modes for some of said code-words, each of said plurality of escape modes using an immediately following code-word to generate a corresponding symbol, wherein a first plurality of code-words are generated from said first symbol during encoding using a first escape mode, said first plurality of code-words comprising said first code-word and a first immediately following code-word, further comprising:

providing a table containing a plurality of entries, wherein said table provides a first entry, a second entry or a third entry as an output in response to respectively receiving said first code-word, said second code-word or said first immediately following code-word (FIFC), wherein said first entry contains data indicating whether the encoding is according to said first escape mode, said second entry indicating said second symbol, and said third entry indicates an intermediate value;

executing a first part which accesses said first entry from said table when decoding said first code-word, said first part examining said first entry to determine that the encoding is according to said first escape mode, said first part receiving said FIFC immediately following said first code-word and accessing said third entry, said first part writing data indicating said first escape mode to an intermediate buffer, said first part accessing said second entry from said table when decoding said second code-word, said first part writing said second symbol to an output buffer; and executing a second part which reads data indicating said first escape mode from said intermediate buffer and performs an operation using said intermediate value consistent with the requirement of said first escape mode according to said approach.

14. The computer readable medium of claim 13, wherein said first part writes data into said intermediate buffer indicating a position of said first symbol according to said sequence, wherein said second part writes said first symbol at said position.

15. The computer readable medium of claim 14, wherein said first part processes a first plurality of symbols and writes corresponding entries in said intermediate buffer and said output buffer, and said second part thereafter starts processing entries in said intermediate buffer and said output buffer.

16. The computer readable medium of claim 15, wherein each of said plurality of symbols contains a run and a level, wherein said first mode comprises escape mode 1, wherein said operation comprises adding a maximum level for a corresponding run value to a level in said intermediate value, wherein the resulting added level and a run in said intermediate value comprise said first symbol.

17. The computer readable medium of claim 15, wherein each of said plurality of symbols contains a run and a level, wherein said first mode comprises escape mode 2, wherein said operation comprises adding a maximum run corresponding to said level to a run in said intermediate value, wherein the resulting added run and a level in said intermediate value comprise said first symbol.

18. The computer readable medium of claim 17, wherein said first part further operates to:

receive a third code-word;

access a third entry from said table based on said third code-word, said third entry indicating that encoding is according to escape mode 3; and writing in said intermediate buffer a fixed number of bits following said third code-word in said stream of code-words, wherein said second part retrieves said fixed number of bits from said intermediate buffer and writes to said output buffer as a third symbol.

19. An apparatus for decoding a sequence of code-words representing a corresponding sequence of symbols in a compressed format according to an approach, said apparatus comprising:

means for receiving a first code-word and then a second code-word, wherein said first code-word and said second code-word are contained in said sequence of code-words, and wherein said first code-word is earlier than said second code-word in said sequence of code-words; and means for generating a first symbol from said first code-word after generating a second symbol from said second code-word, wherein said first code-word and said second code-word respectively are encoded using said first symbol and said second symbol according to said approach.

20. The apparatus of claim 19, wherein said approach encodes symbols using variable length code-words.

* * * * *